United States Patent [19]
Tran

[11] Patent Number: 4,984,211
[45] Date of Patent: Jan. 8, 1991

[54] BATTERY BACKUP BUS SCHEME FOR AN ECL BICMOS SRAM

[75] Inventor: Hiep V. Tran, Carrollton, Tex.

[73] Assignee: Texas Instruments Incorporated, Dallas, Tex.

[21] Appl. No.: 156,400

[22] Filed: Feb. 16, 1988

[51] Int. Cl.$^5$ .............................................. G11C 13/00
[52] U.S. Cl. .................................. 365/229; 365/189.01
[58] Field of Search ................... 371/66; 365/229, 189, 365/230, 184, 189.01, 189.06

[56] References Cited

U.S. PATENT DOCUMENTS

| | | | |
|---|---|---|---|
| 4,710,905 | 12/1987 | Uchida | 365/229 |
| 4,740,918 | 4/1988 | Okajima | 365/226 |
| 4,754,167 | 6/1988 | Conkle et al. | 365/226 |
| 4,771,407 | 9/1988 | Takemae et al. | 365/226 |

Primary Examiner—Terrell W. Fears
Attorney, Agent, or Firm—Rodney M. Anderson; Melvin Sharp

[57] ABSTRACT

A static random access memory is disclosed which has a first power supply terminal for receiving a power supply voltage for powering the periphery of the device and the array, and which has a second power supply terminal for receiving a power supply voltage for powering the array only. A diode may be connected between the two terminals to effect the biasing of the array from the first power supply terminal but not from the second power supply terminal. The memory may be incorporated into a system which has a power fail detector for controlling a switch, so that the battery is connected to the second power supply terminal when the main power supply has failed, but so that the main power supply is connected thereto when operable.

9 Claims, 4 Drawing Sheets

BATTERY BACKUP BUS SCHEME FOR AN ECL BICMOS SRAM

This application is related to applications S.N. 156,520 and S.N. 158,017 filed contemporaneously herewith.

This invention is in the field of electronic integrated circuits, and is specifically directed to circuits for use in read/write memory devices with provision for battery backup.

BACKGROUND OF THE INVENTION

Static random access memory (SRAM) devices may be powered by a battery, or other temporary power source, in the event of a power supply failure, in order to retain the data stored therewithin. In prior configurations, a single power supply pin for receiving the power supply voltage from either or both a power supply source or a battery has been provided, so that the user may continue powering the SRAM from an off-chip source. Without special circuitry on-chip, however, the externally applied battery must not only power the array to maintain the stored data therewithin, but must also power the peripheral circuitry such as decoders and sensing circuits. In most SRAM devices, the power dissipation in the array to maintain the stored data is minimal, but the peripheral circuitry may draw significant power from the off-chip battery, decreasing the length of time that the battery is able to maintain the stored data in the array.

On-chip circuitry has been provided which turns off the peripheral circuitry in a battery backup mode, so that the battery applied to the single power supply pin powers only the array and not the peripheral circuitry. One method of such decoupling of the peripheral circuitry from the single power supply pin is to provide a power-down pin, which receives an external signal indicating that the power supply is to be decoupled from the periphery and maintained only for the memory array. When the power-down pin receives a power-down signal, all current sources and DC current paths will be turned off, and all peripheral circuitry will be placed in a high impedance (low leakage) state; this requires a significant amount of gating to accomplish, responsive to the single input signal. A special problem exists for the use of such circuitry responsive to an externally driven power-down pin where the SRAM is fabricated using BiCMOS technology, where both bipolar and MOS transistors are utilized on the same chip, especially where the logic in the peripheral circuitry is realized in emitter-coupled logic (ECL) fashion in the case of a power failure (after which a power-down signal is externally generated and presented to the power-down pin of the SRAM). Internally for the SRAM, $V_{cc}$ in an ECL SRAM application will generally be referred to as a common ground for maximum ECL signal margin; $V_{ee}$ will be referred to as a voltage negative with respect to the ground of $V_{cc}$. When the circuitry is incorporated in ECL, the power failure causing $V_{cc}$ to collapse toward $V_{ee}$ will also cause the ECL buffer receiving the power-down signal to have its differential inputs also collapse toward each other, which may cause the power-down signal presented to the power-down pin to go undetected.

Referring to FIG. 5, another problem exists due to the use of a single power supply pin. FIG. 5 illustrates a cross-sectional diagram of a p-channel MOS transistor as would be incorporated into a CMOS inverter in the BiCMOS SRAM. Source region 100 and drain region 101 are p+ regions diffused into n-type well 102 formed in p-type substrate 104, with gate electrode 105 disposed over gate dielectric 107 between source region 100 and drain region 101. Source region 100 and n-well region 102 is connected nominally to $V_{cc}$, the single power supply pin, while the p-type substrate 104 is nominally connected to $V_{ee}$. In battery backup mode, it is often preferable for the voltage of the battery to be reduced from the normal operating voltage applied to the single $V_{cc}$ terminal, for reduction of the power drain on the battery. However, drain region 101 of FIG. 5 may be connected to an external pin which is floating in the battery backup mode. If drain region 101 floats or is otherwise pulled to a voltage above $V_{cc}$ applied from the battery, the parasitic p-n-p transistor illustrated in FIG. 5 which has drain region 101 as the emitter, n-well region 102 as the base, and substrate 104 as the collector will turn on, draining current from $V_{cc}$ into n-well 102 to the collector of substrate 104 for bipolar conduction. Such parasitic bipolar conduction would drain a battery connected to the single power supply pin $V_{cc}$.

It is therefore an object of this invention to provide a battery backup capability which does not require on-chip power-down circuitry.

It is a further object of this invention to provide such capability which does not excessively drain the battery supply due to bipolar conduction.

Other objects of the invention will become apparent to those of ordinary skill in the art having reference to this specification in conjunction with the drawings.

SUMMARY OF THE INVENTION

The invention may be incorporated into an SRAM device having a first power supply pin for biasing the peripheral circuitry, and having a second power supply pin for biasing the array. The first power supply pin may also be used to bias the array by providing a diode connected between the first power supply pin and the second power supply pin in a direction which allows the first power supply pin to bias the array, but which prevents the second power supply pin from biasing the periphery.

DETAILED DESCRIPTION OF THE PREFERRED EMBODIMENT

Figure 1:
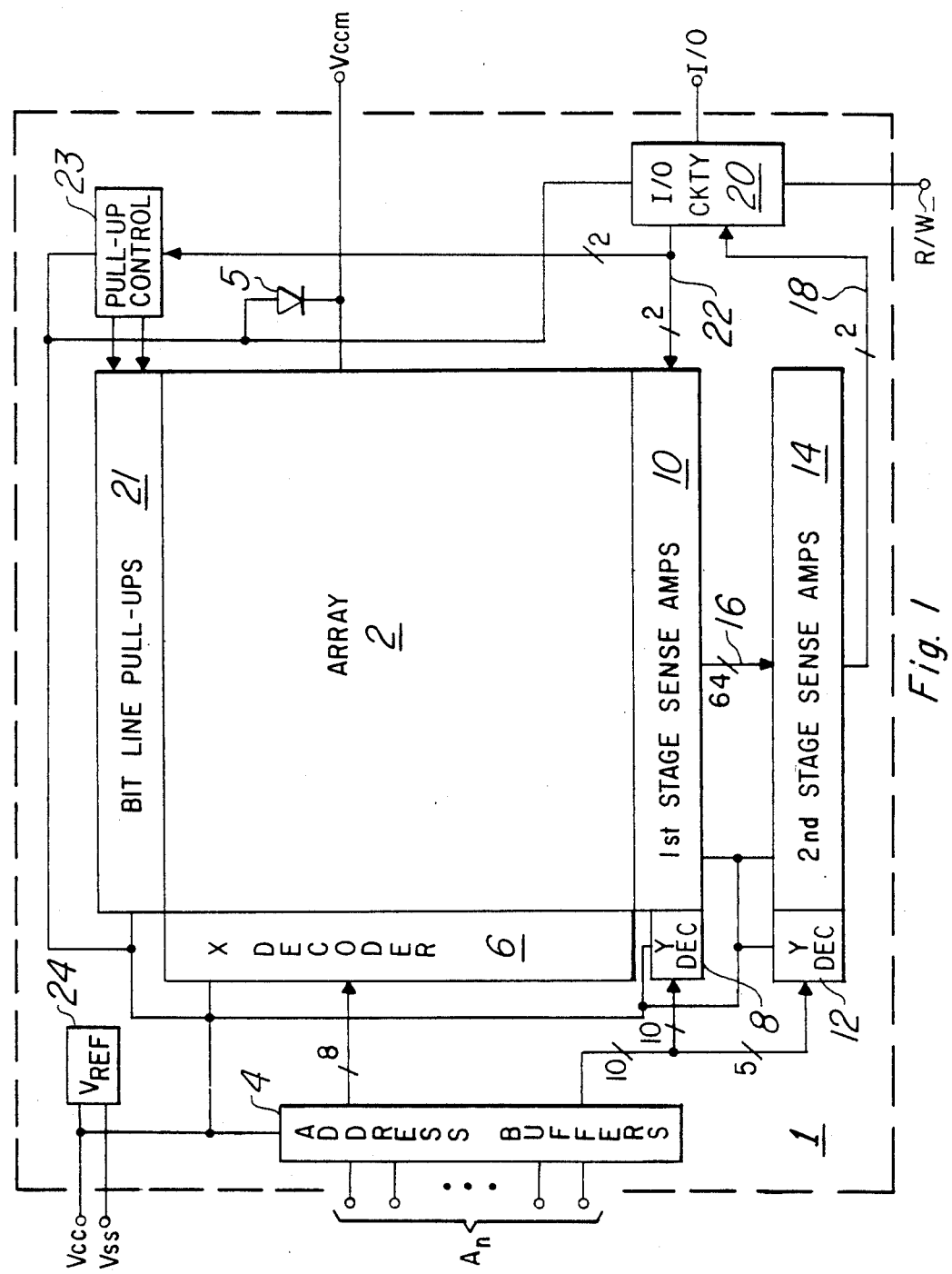
FIG. 1 is an electrical diagram, in block form, of a static random access memory (SRAM) incorporating the invention.

Referring now to FIG. 1, a block diagram of a static random access memory (SRAM) 1 is illustrated. This embodiment of SRAM 1 is a 256 k bit memory, having a single input/output terminal I/0 (i.e., SRAM 1 is organized as a 256 k by 1 memory). The storage elements of SRAM 1 are contained in array 2, which in this embodiment is organized into 256 rows by 1024 columns. Each of the storage elements of SRAM 1 are cross-coupled CMOS inverters which are powered from power supply terminal $V_{ccm}$, as shown in FIG. 1. SRAM 1 receives address information on address inputs $A_n$. To individually address each bit within the 256 k bit memory, address inputs $A_n$ number eighteen. Of course, if more than one bit were to be accessed at a time (for example, if 256 k bit SRAM 1 were organized as a 32 k by 8 memory, having eight inputs and eight outputs), fewer address inputs $A_n$ would be required.

Address inputs An are received by address buffers 4 which, as is well known in the art, latch and retain the value of the address externally presented at address inputs An. Eight of the eighteen address bits received by address buffers 4, such eight bits corresponding to a row address, are communicated to X decoder 6, for selecting one of the 256 rows in array 2. The remaining ten bits received by address buffers 4, corresponding to a column address, are communicated to first stage Y decoder 8, for selection of one of the 1024 columns in array 2 to be sensed by one of the 1024 first stage sense amplifiers 10. Each of the 1024 columns, and accordingly each of the 1024 first stage sense amplifiers, are associated with a complementary pair of bit lines, as will be described hereinbelow, and the selected one of the 1024 first stage sense amplifiers senses the differential voltage of the complementary bit lines. A bank of bit line pull-up transistors 21 are provided in SRAM 1, as will be explained in further detail below.

Five of the ten column address bits are also communicated to second stage Y decoder 12, for selection of one of the second stage sense amplifiers 14. While FIG. 1 illustrates two separate Y decoders 8 and 12, second stage Y decoder 12 may alternatively be incorporated into first stage Y decoder 8. Such incorporation would use the output of the second stage sense amplifier 14 not only to select the appropriate second stage sense amplifier 14 but also in the decoding of the column address signal to select one of the first stage sense amplifiers 10, if multiple decoding stages are desired within first stage Y decoder 8 and if the break between decode stages therewithin is made at the point necessary to select one of the second stage sense amplifiers 14. The 1024 first stage sense amplifiers 10 are grouped into thirty-two groups of thirty-two, with each group having a complementary pair of local data lines 16 as an output. One of second stage sense amplifiers 14 is associated with each group of thirty-two first stage sense amplifiers, and receives at its input the associated pair of local data lines 16. A complementary pair of data-out lines 18 are driven by second stage sense amplifiers 14. In operation, the first stage sense amplifier 10 which corresponds to the column address is enabled by a signal from first stage Y decoder 8, while Y decoder 8 disables the others of first stage sense amplifiers 10 from sensing the data state of its associated pair of bit lines from array 2. The one of second stage sense amplifiers 14 which corresponds to the group of first stage sense amplifiers 10 having the selected column is also enabled, and the others of second stage sense amplifiers 14 are disabled. The selected one of second stage sense amplifiers 14 presents, on data-out lines 18, a differential voltage which is the amplification of the differential voltage on the local data lines 16 at its input, for communication to input/output circuitry 20. Input/output circuitry 20 communicates the state of data-out lines 18 to input/output terminal I/0

Input/output circuitry 20 of SRAM 1 of FIG. 1 also receives input data from input/output terminal I/0; the determination of whether a read or a write cycle is desired depends upon the state of terminal R/W_, connected to input/output circuitry 20. During a write cycle, input/output circuitry 20 presents the logic state externally presented at input/output terminal I/0 onto data-in bus 22, which presents the true and complement states of the input data to first stage sense amplifiers 10 for communication to the selected memory cell in array 2. Data-in bus 22 is also connected to pull-up control circuitry 23, to effect the write recovery operation described in further detail hereinbelow.

SRAM 1 also has reference voltage circuit 24, which receives the power supply voltages $V_{cc}$ and $V_{ee}$ (ground potential). Power supply voltages $V_{cc}$ and $V_{ee}$ are routed to transistors throughout SRAM 1 for biasing purposes. According to the invention, the voltage from power supply terminal $V_{cc}$ is routed to each of the peripheral blocks within SRAM 1, i.e., the circuitry in SRAM 1 not including array 2. In FIG. 1, biasing from the $V_{cc}$ terminal is provided to reference voltage circuit 24, address buffers 4, X decoder 6, first and second stage Y decoders 8 and 12, first and second stage sense amplifiers 10 and 14, input/output circuitry 20, bit line pull-ups 21 and pull-up control circuitry 23. The routing from reference supply $V_{ee}$ is not shown in FIG. 1 for purposes of clarity. The particular embodiment of SRAM 1 described herein is a BiCMOS SRAM, utilizing both bipolar transistors, as well as p-channel and n-channel MOS transistors. Certain circuits in this embodiment of SRAM 1 are realized in emitter-coupled logic. Where emitter-coupled logic is used, reference voltage circuit 24 provides a band-gap reference voltage.

According to the invention, power supply terminal $V_{ccm}$ provides for an alternate power supply source to be connected to SRAM 1 for powering the array, such as a battery. Diode 5 is provided within SRAM 1, having its anode connected to a line from power supply terminal $V_{cc}$, and having its cathode connected to a line from power supply terminal $V_{ccm}$. This allows a single power supply connected to terminal $V_{cc}$ to power both the periphery and array 2 if no alternate power source is connected to terminal $V_{ccm}$, or in the usual battery backup system where the voltage of a battery connected to terminal $V_{ccm}$ is lower than the voltage of the power supply connected to $V_{cc}$. The use of a battery with a lower voltage than the $V_{cc}$ power supply allows the $V_{cc}$ power supply to power the array in normal operation, minimizing current drawn from the lower voltage battery connected to terminal $V_{ccm}$. When $V_{cc}$ is not present, the alternate power source connected to terminal $V_{ccm}$ can power array 2. It should be noted that no on-chip gating circuitry is required to turn off the peripheral circuitry, as described hereinabove relative to the single power supply terminal SRAM devices.

Figure 2:
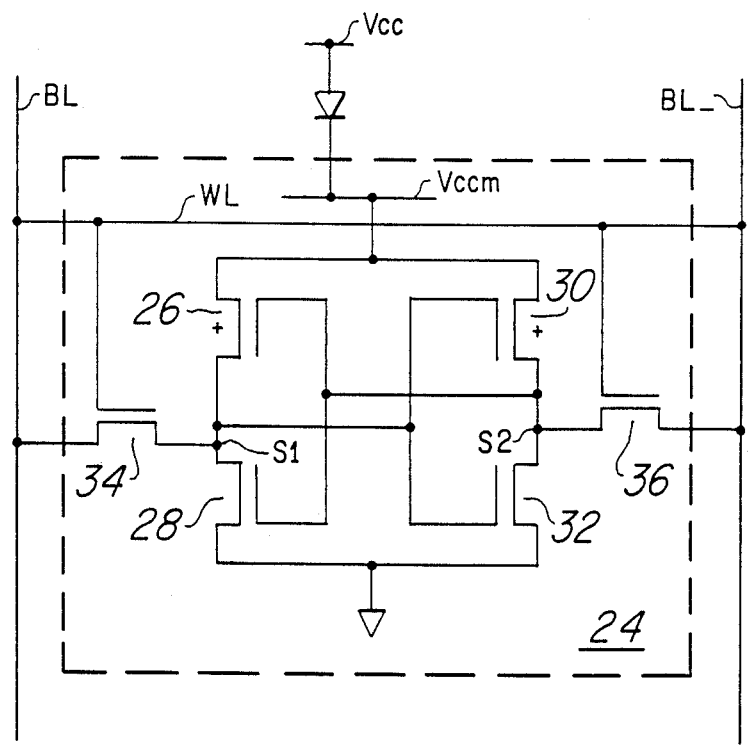
FIG. 2 is an electrical diagram, in schematic form, of a conventional CMOS memory cell as can be used in the SRAM of FIG. 1.

Referring now to FIG. 2, a conventional CMOS static memory cell 24 as incorporated into BiCMOS SRAM 1 is illustrated. Memory cell 24 is constructed according to the well-known cross-coupled inverter realization; since both p-channel and n-channel transistors are available, CMOS inverters are used in memory cell 24. A first CMOS inverter in memory cell 24 is made up of p-channel transistor 26 and n-channel transistor 28 having their source-to-drain paths connected in series between $V_{ccm}$ and ground, and having their gates tied together. The second CMOS inverter in memory cell 24 is similarly constructed, with p-channel transistor 30 and n-channel transistor 32 having their source-to-drain paths connected in series between $V_{ccm}$ and ground, and their gates also common. The cross-coupling is accomplished by the gates of transistors 26 and 28 being connected to the drains of transistors 30 and 32 (node S1 of FIG. 2), and by the gates of transistors 30 and 32 being connected to the drains of transistors 26 and 28 (node S2 of FIG. 2). N-channel pass transistor 34 has its source-to-drain path connected between node S1 and a first bit line BL, and has its gate connected to word line WL. N-channel pass transistor 36 similarly has its source-to-drain path connected between node S2 and a second bit line BL_, and has its gate also connected to word line WL. Diode 5 is shown in FIG. 2, illustrating the connection of the $V_{ccm}$ power supply terminal to the $V_{cc}$ power supply terminal as described hereinabove.

Figure 5:
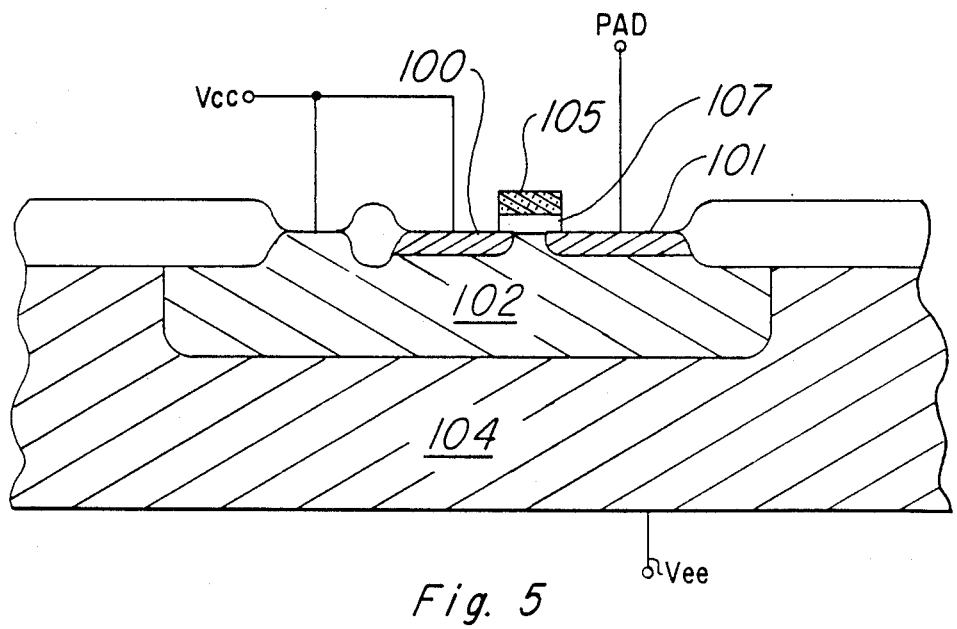
FIG. 5 is a cross-sectional diagram illustrating a parasitic p-n-p transistor.

It should be noted that the p-channel transistors 26 and 30 in each of memory cells 24 can be fabricated into an n-well 102 which is isolated from the n-wells used in the peripheral circuitry. Since there are no external pins connected into any of the memory cells 24 other than $V_{ccm}$ and since the n-well 102 can be isolated from the other n-wells, there can be no parasitic bipolar conduction occurring through memory cells 24 in array 2 from terminal $V_{ccm}$, causing the excessive battery drain as discussed above relative to FIG. 5. The only parasitic p-n-p transistors with floating p+ regions will be for those n-wells 102 having $V_{cc}$, rather than $V_{ccm}$, biasing the n-wells.

In operation, the voltages of node S1 and S2 will necessarily be logical complements of one another, due to the cross-coupled nature of the CMOS inverters within memory cell 24. When word line WL is energized by X decoder 6 shown in FIG. 1, according to the row address received at address inputs $A_n$, pass transistors 34 and 36 will be turned on, coupling nodes S1 and S2 to bit lines BL and BL_, respectively. Accordingly, the state of bit lines BL and BL_will be logical complements of one another when a memory cell 24 is connected thereto by the energizing of word line WL.

As described above for this embodiment, there are 256 word lines WL and 1024 pairs of bit lines BL and BL_in array 2 of FIG. 1. For each value of the row address decoded by X decoder 6, one word line WL will be energized connecting 1024 memory cells 24 to the 1024 pairs of bit lines BL and BL_. Since the other 255 word lines WL will be at a low logic level, only the one memory cell 24 associated with the selected word line WL in each column will be connected to the pair of bit lines BL and BL_at a time.

Figure 3:
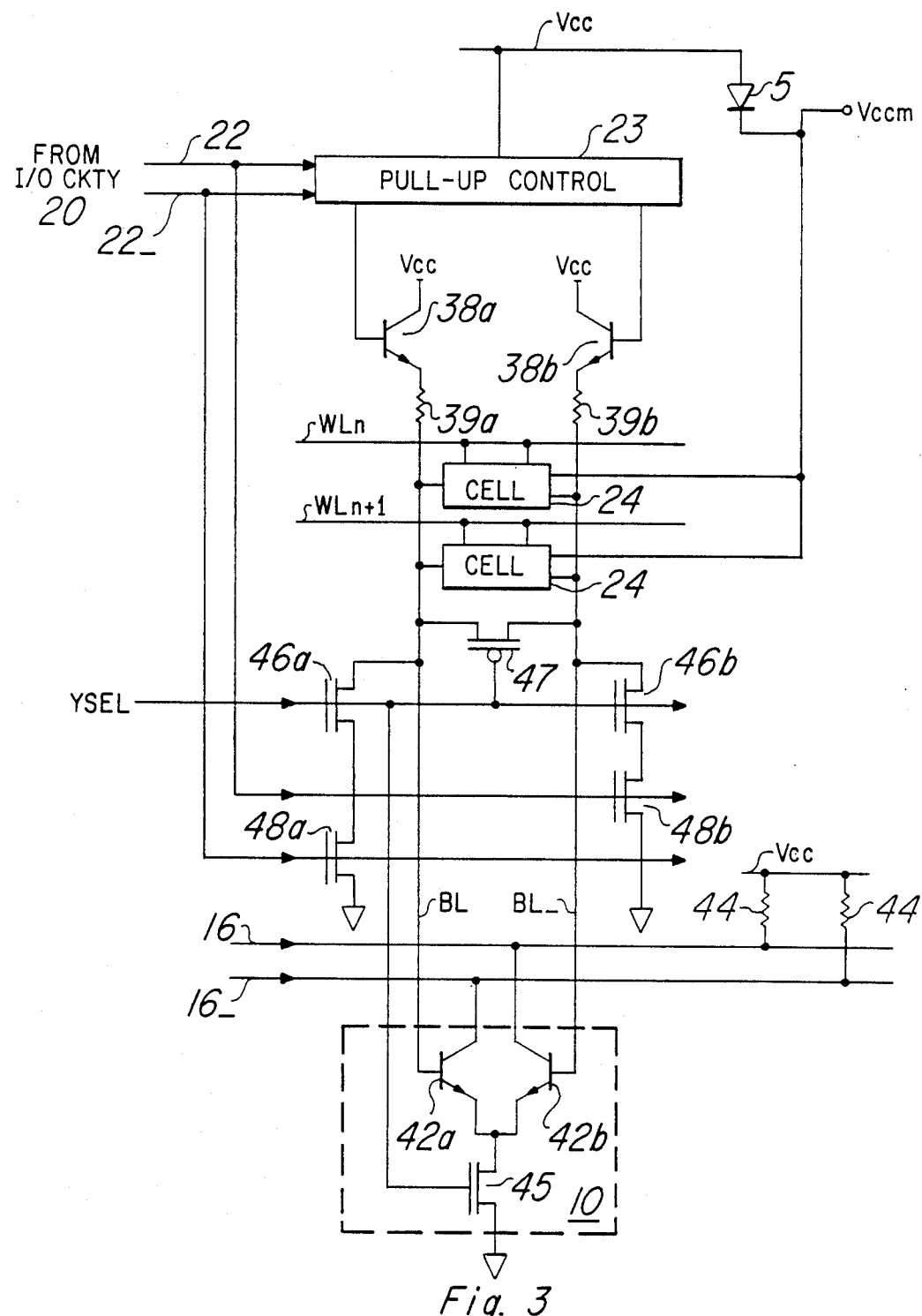
FIG. 3 is an electrical diagram, in schematic form, of a bit line pair in conjunction with the bit line pull-up circuitry and first stage sense amplifier.

Referring now to FIG. 3, a column of array 2 is illustrated, for purposes of illustrating BiCMOS circuitry powered from the $V_{cc}$ terminal in SRAM 1 according to the invention. Only two memory cells 24 are illustrated, in conjunction with only two word lines $WL_n$ and $WL_{n+1}$, for purposes of clarity; as described above, each column has 256 memory cells 24 associated with 256 independent word lines WL. In the column shown in FIG. 3, cells 24 are shown connected to complementary bit lines BL and BL_. Bit lines BL and BL_are connected to first stage sense amplifier 10 and, via n-p-n pull-up transistors 38a and 38b, respectively, to $V_{cc}$. Pull-up transistors 38 correspond to bit line pull-ups 21 shown in FIG. 1. The bases of pull-up transistors 38a and 38b are driven by pull-up control circuitry 23, which receives clocked input data from input/output circuitry 20 on data-in bus 22. Pull-up resistors 39a and 39b are connected between the emitter of transistors 38a and 38b and bit lines BL and BL_, respectively, to optimize the timing of the cross-over of bit lines BL and BL_(indicating the sensed data) when pulled up by transistors 38a and 38b in a read operation. Pull-up control circuitry 23 consists of logic which operates responsive to the data state on data-in bus 22 to control the biasing of the bases of transistors 38a and 38b as necessary for the operation of the desired cycle. For a read cycle, both of data-in bus lines 22 will be at a low state, and pull-up control circuitry 23 will bias the bases f transistors 38a and 38b to $V_{cc}$. The biasing of the bases of transistors 38a and 38b in a write operation will b described hereinbelow.
e
First stage sense amplifier 10 consists of two emitter-coupled n-p-n transistors 42a and 42b, which have their bases connected to bit lines BL and BL_, respectively. The emitters of transistors 42a and 42b are connected to the drain n-channel transistor 45, which has its source coupled to ground and its gate connected to line YSEL. Transistor 45 is turned off when the column is not selected (i.e., line YSEL low), and is turned on to act as a current source when the column is selected (i.e., line YSEL high). Line YSEL also is connected to p-channel transistor 47, which serves to equalize bit lines BL and BL_when transistor 47 is on due to line YSEL low. Line YSEL, for a particular column, is low during cycles in which the column is not selected, equalizing bit lines BL and BL_. The collectors of transistors 42a and 42b are connected to local data lines 16_and 16, respectively. As described above for this embodiment, thirty-two first stage sense amplifiers 10 share local data lines 16 and 16_. Local data lines 16 and 16a_are pulled up to $V_{cc}$ by resistors 44.

The write circuitry for a particular column consists of n-channel transistors 48a and 48b, which have their source-to-drain paths connected in a path between bit lines BL and BL_, respectively, and ground. The gates of n-channel transistors 48a and 48b are controlled by data-in lines 22_and 22, respectively, one of which is taken to a high logic level at the time that a write operation is to occur, with the choice between data-in line 22 and 22_depending upon the input data received at input/output terminal I/0. For a write operation, pull-up control circuitry will respond to one of data-in lines 22 being at a high state to bias the base of the transistor 38 associated with the bit line BL or BL_which will be pulled low to $V_{ee}$, and to bias the base of the transistor 38 associated with the other bit line to $V_{cc}-2V_{be}$. During read cycles, both data-in lines 22 and 22_remain at a low logic level. N-channel transistors 46a and 46b are connected in series between transistors 48a and 48b, on the one hand, and bit lines BL and BL_, respectively, on the other hand. The gates of both of transistors 46a and 46b are controlled by line YSEL, so that the state of data-in lines 22 and 22_affects only the selected one of the 1024 columns, and is isolated from the other columns.

Figure 4:
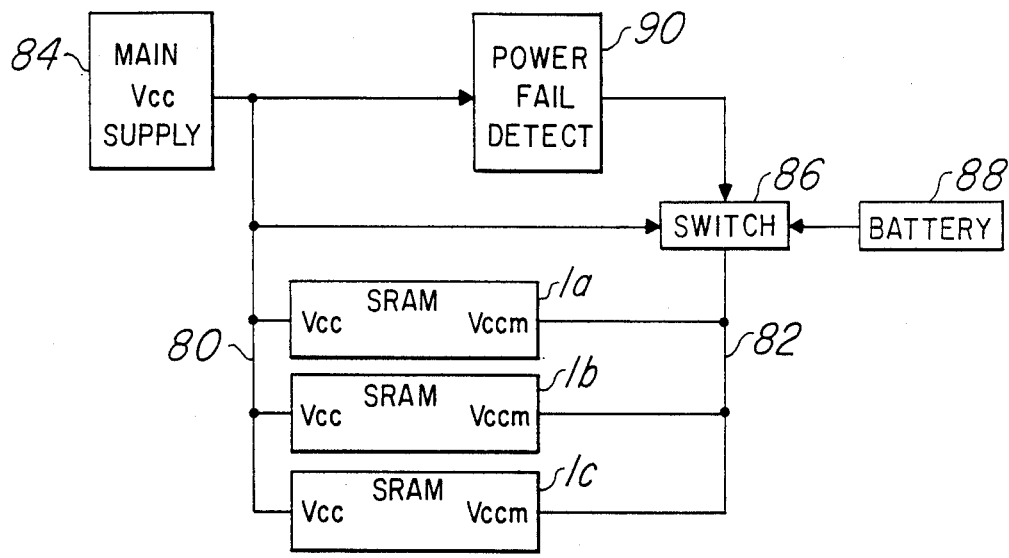
FIG. 4 is an electrical diagram, in block form, of a battery backup system incorporating an SRAM constructed according to the invention.

Referring now to FIG. 4, a simple system incorporating multiple ones of SRAM 1 constructed according to the invention is illustrated. Terminals $V_{cc}$ and $V_{ccm}$ of SRAMs 1a, 1b and 1c are connected into two separate buses 80 and 82, respectively. Bus 80 is powered by main $V_{cc}$ power supply 84. Main $V_{cc}$ power supply 84 is also connected to an input of an electronic switch 86. Electronic switch 86 also receives at another input the output of a battery 88, and receives at a control input the output of a power fail detector 90. Electronic switch 86 and power fail detector 90 are readily available to those in the art. The output of electronic switch 86 is connected to bus 82, which is connected to each of the $V_{ccm}$ terminals of SRAMs 1a, 1b, and 1c. Electronic switch 86 is responsive to the signal received at its control input from power fail detector 90, so that it connects main $V_{cc}$ power supply 84 to bus 82 where power fail detector 90 detects the presence of sufficient power thereat, and connects batter 88 to bus 82 responsive to power fail detector 90 detecting the failure of main $V_{cc}$ power supply 84 to source a voltage above a certain level. The system of FIG. 4 is thus able to respond to the presence or absence of power from main power supply 84 to provide the battery backup to SRAMs 1a, 1b, and 1c for the retention of data stored therewithin.

Although the invention has been described in detail herein with reference to its preferred embodiment, it is to be understood that this description is by way of example only, and is not to b(R)construed in a limiting sense. It is to be further understood that numerous changes in the details of the embodiments of the invention, and additional embodiments of the invention, will be apparent to, and may be made by, persons of ordinary skill in the art having reference to this description. It is contemplated that such changes and additional embodiments are within the spirit and true scope of the invention as claimed below.

I claim:

1. A memory device, comprising:
   an array of memory cells for storing data therewithin;
   peripheral circuitry for accessing the data stored in said array;
   a first power supply terminal, connected directly to said peripheral circuitry, and connected to said array through a diode having its anode connected to said first power supply terminal and having its cathode connected to said array, for receiving a biasing voltage for biasing said peripheral circuitry and said array of memory cells;
   a second power supply terminal connected to said array and to the cathode of said diode for receiving a biasing voltage for biasing the array, so that the memory cells in said array can retain data in the absence of a biasing voltage received by said first power supply terminal;
   a reference power supply terminal connected to both the array and the peripheral circuitry for providing a reference biasing voltage thereto.

2. The memory device of claim 1,
   wherein each of said memory cells comprise:
   a first inverter having an input and an output, said first inverter biased by said second power supply terminal and said reference power supply terminal;
   a second inverter having an input and an output, said input of said second inverter connected to the output of said first inverter and said output of said second inverter connected to the input of said first inverter, said second inverter biased by said second power supply terminal and said reference power supply terminal.

3. The memory device of claim 2, wherein said first and second inverters are CMOS inverters.

4. The memory device of claim 2, wherein said peripheral circuitry contains bipolar transistors.

5. The memory device of claim 2, wherein said peripheral circuitry contains emitter-coupled bipolar transistors.

6. The memory device of claim 2, wherein said array is formed in a p-type substrate;
   wherein said first and second inverters each comprise a p-channel pull-up transistor formed in an n-well in said p-type substrate and an n-channel pull-down transistor;
   wherein said peripheral circuitry contains p-channel transistors formed in an n-well in said p-type substrate;
   and wherein said n-well in said array is isolated from said n-well in said periphery.

7. A memory system, comprising:
   a memory device comprising:
   an array of memory cells for storing data therewithin;
   peripheral circuitry for accessing the data stored in said array;
   a first power supply terminal connected to said peripheral circuitry for receiving a biasing voltage for biasing said peripheral circuitry;
   a second power supply terminal connected to said array for receiving a biasing voltage for biasing the array; and
   a reference power supply connected to both the array and the peripheral circuitry for providing a reference biasing voltage thereto;
   a main power supply source connected to said first power supply terminal;
   a power fail detector connected to said main power supply source, and having an output;
   a battery;
   a switch having a first input connected to said main power supply source, a second input connected to said battery, an output connected to said second power supply terminal, and a control input connected to said power fail detector so that said main power source is connected to said second power supply terminal responsive to said power fail detector detecting said main power source being above a predetermined voltage, and so that said battery is connected to said second power supply terminal responsive to said power fail detector detecting said main power source being below said predetermined voltage.

8. The memory system of claim 7, wherein the voltage of said battery is below the nominal voltage of said main power supply.

9. The memory system of claim 7, wherein said memory further comprises:
   a diode having an anode connected to said first power supply terminal and having a cathode connected to said second power supply terminal.

* * * * *